United States Patent
Min

(10) Patent No.: US 9,601,544 B2
(45) Date of Patent: Mar. 21, 2017

(54) THREE-DIMENSIONAL MAGNETIC MEMORY ELEMENT

(71) Applicant: IMEC, Leuven (BE)

(72) Inventor: Tai Min, Wilsele (BE)

(73) Assignee: IMEC, Leuven (BE)

( * ) Notice: Subject to any disclaimer, the term of this patent is extended or adjusted under 35 U.S.C. 154(b) by 34 days.

(21) Appl. No.: 14/332,018

(22) Filed: Jul. 15, 2014

(65) Prior Publication Data
US 2015/0021675 A1  Jan. 22, 2015

(30) Foreign Application Priority Data
Jul. 16, 2013  (EP) ..................... 13176685

(51) Int. Cl.
*H01L 27/22*  (2006.01)
*H01L 43/12*  (2006.01)
*H01L 43/08*  (2006.01)

(52) U.S. Cl.
CPC ............ *H01L 27/228* (2013.01); *H01L 43/08* (2013.01); *H01L 43/12* (2013.01)

(58) Field of Classification Search
CPC ..... G11C 11/155; G11C 11/02; H01L 27/228; H01L 43/02; H01L 43/08; H01L 43/12
USPC ......... 257/421, 108, 295, 3; 360/324.2, 326; 365/157, 158, 171, 173; 438/3
See application file for complete search history.

(56) References Cited

U.S. PATENT DOCUMENTS

| | | | |
|---|---|---|---|
| 2003/0183889 A1* | 10/2003 | Kajiyama | G11C 11/155 257/421 |
| 2010/0003767 A1* | 1/2010 | Cho | H01L 43/08 438/3 |
| 2011/0012081 A1* | 1/2011 | Yoon | H01L 27/224 257/2 |
| 2011/0103143 A1* | 5/2011 | Ranjan | G11C 11/14 365/171 |
| 2013/0240964 A1* | 9/2013 | Ozeki | G11C 11/161 257/295 |
| 2014/0038310 A1* | 2/2014 | Abraham | G11C 11/161 438/3 |
| 2014/0084387 A1* | 3/2014 | Dewey | H01L 29/0665 257/410 |
| 2015/0001720 A1* | 1/2015 | Lin | H01L 23/53238 257/751 |

* cited by examiner

*Primary Examiner* — Victoria K Hall
(74) *Attorney, Agent, or Firm* — Knobbe, Martens, Olson & Bear LLP

(57) ABSTRACT

The disclosed technology relates to a magnetic memory device. In one aspect, the device includes a first electrode comprising a conductive pillar formed over the substrate and elongated in a vertical direction crossing a lateral surface of the substrate. The device additionally includes a second electrode extending in a lateral direction crossing the first direction, where the second electrode intersects the first electrode. The device additionally includes a magnetic tunnel junction (MTJ) formed at an intersection between the first electrode and the second electrode, where the MTJ continuously surrounds the first electrode. The MTJ includes a reference layer continuously surrounding the pillar of the first electrode, a free layer continuously surrounding the free layer, and a dielectric tunnel barrier interposed between the reference layer and the free layer.

22 Claims, 14 Drawing Sheets

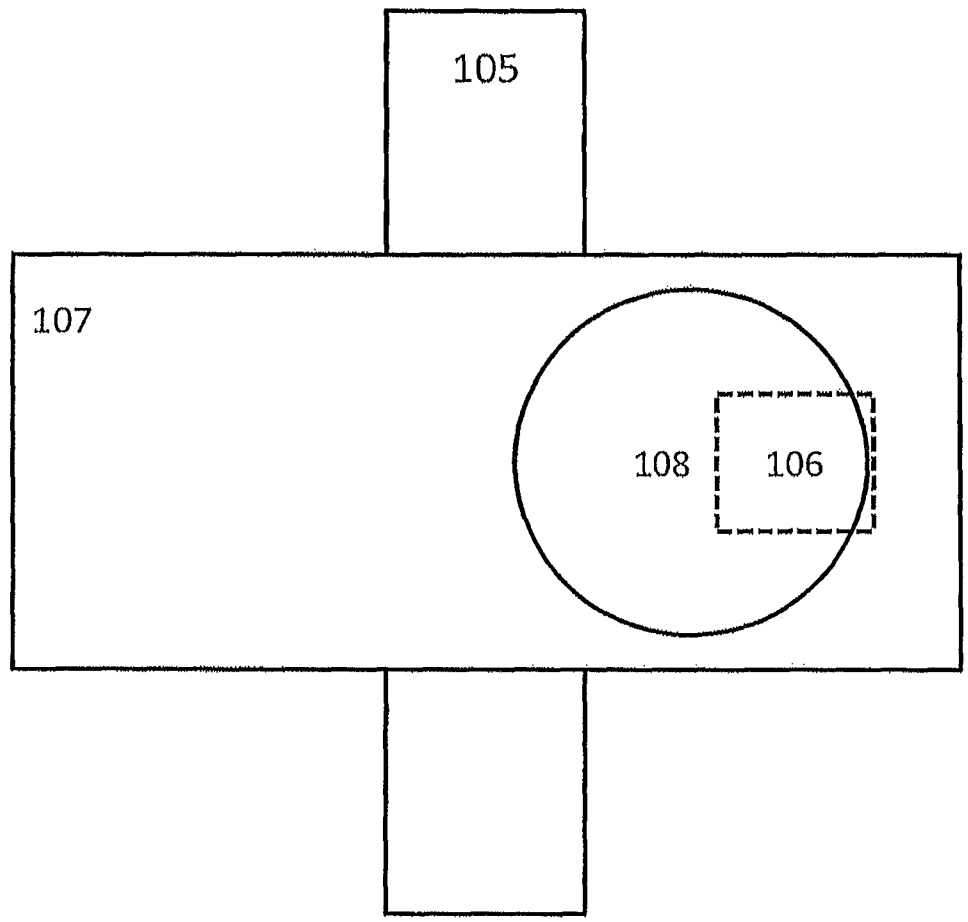
*Prior Art*
FIGURE 1B (Top view of Figure 1A)

THREE-DIMENSIONAL MAGNETIC MEMORY ELEMENT

CROSS-REFERENCE TO RELATED APPLICATIONS

This application claims foreign priority to European patent application EP 13176685.9, filed on Jul. 16, 2013, the content of which is incorporated by reference herein in its entirety.

BACKGROUND OF THE INVENTION

Field of the Invention

The disclosed technology generally relates to magnetic memory devices, and more particularly to spin transfer torque magnetic random access memory (STT-MRAM) devices having a magnetic tunnel junction (MTJ) cell and methods of fabricating the STT-MRAM devices.

Description of the Related Technology

Magnetic random access memory (MRAM) is emerging as an alternative to conventional semiconductor memories such as SRAM, DRAM and/or flash memory. Compared to volatile memories such as SRAM and DRAM, MRAM can be advantageous because it can be designed to be non-volatile (e.g., data retention of >10 years). Compared to non-volatile memories such as flash memory used for storage application, MRAM can be advantageous because it can offer high endurance (e.g., greater than $10^6$ cycles of memory access).

As compared to field-switchable MRAM devices that were studied in the earlier part of the last decade, spin transfer torque magnetic random access memory, also referred to as spin-torque transfer magnetic random access memory (STT-MRAMs), have gained popularity in part due to their potential to be scaled to very small sizes. It has been recognized that scalability of STT-MRAMs can be limited by thermal stability, as well as by writability. Two different geometries, one with an in-plane magnetization direction and another one with an out-of-plane (perpendicular) magnetization direction, have been proposed. It has been suggested that, while the former may be implemented at entry level, the latter may be more promising to be implemented as a more scalable geometry of the two different geometries of magnetic tunnel junction (MTJ) cells, especially from switching and thermal stability perspectives.

A STT-MRAM device typically includes an MTJ element which in turn includes a tunnel barrier layer sandwiched between a reference layer and a free layer. As there are a lot of scaling issues and device performance issues (for example thermal stability of the device) to tackle when going down to sub-1×nm technology, there is a further need for improved STT-MRAM device and methods for fabricating such a device.

SUMMARY OF CERTAIN INVENTIVE ASPECTS

In one aspect, the device includes a first electrode comprising a conductive pillar formed over the substrate and elongated in a vertical direction crossing a lateral surface of the substrate. The device additionally includes a second electrode extending in a lateral direction crossing the first direction, where the second electrode intersects the first electrode. The device additionally includes a magnetic tunnel junction (MTJ) formed at an intersection between the first electrode and the second electrode, where the MTJ continuously surrounds the first electrode. The MTJ includes a reference layer continuously surrounding the pillar of the first electrode, a free layer continuously surrounding the free layer, and a dielectric tunnel barrier interposed between the reference layer and the free layer. The MTJ is configured to tunnel spin-polarized electrons from the reference layer through the tunnel barrier to the free layer to cause a change in the magnetic orientation of the free layer.

In another aspect, a three dimensional magnetic memory device comprises a conductive inner electrode comprising a cylindrical pillar formed on a bottom electrode and extending in a vertical direction. The memory device additionally includes a conductive outer electrode extending in a lateral direction and at least partially surrounding the conductive inner electrode, wherein the conductive outer electrode is separated from the bottom electrode by an intermetal dielectric material. The memory device additionally includes a cylindrical magnetic tunnel junction (MTJ) comprising a cylindrical shell structure extending in the vertical direction and radially interposed between the outer electrode and the pillar of the inner electrode, the cylindrical MTJ comprising an insulating layer interposed between a free layer and a reference layer and a seed layer, wherein the free layer comprises a cylindrical layer contacting the outer electrode, and wherein the cylindrical MTJ is vertically separated from the bottom electrode by the intermetal dielectric material.

In another aspect, a three dimensional magnetic memory device comprises: a conductive inner electrode on a bottom electrode; a conductive outer electrode at both sides of the conductive inner electrode, the conductive outer electrode separated from the bottom electrode by an intermetal dielectric layer; a cylindrical magnetic tunnel junction disposed vertically in between the outer electrode and the inner electrode, the cylindrical magnetic tunnel junction comprising an insulating layer sandwiched in between a free layer and a reference layer, wherein the free layer being a cylindrical layer in physical contact with the outer electrode and the reference layer being a cylindrical layer in physical contact with the inner electrode; the cylindrical magnetic tunnel junction being separated from the bottom electrode by the intermetal dielectric layer.

In another aspect, a method of fabricating a magnetic tunnel junction (MTJ) device includes providing a bottom electrode extending in a lateral direction and forming an intermetal dielectric (IMD) material on the bottom electrode. The method additionally includes forming a conductive vertical inner electrode comprising a pillar contacting the bottom electrode and having an exposed portion extending through the IMD material. The method additionally includes forming a conformal magnetic tunnel junction (MTJ) material stack uniformly covering the IMD and the pillar, the stack including a seed material, a reference layer material, an insulating layer material and a free layer material. The method additionally includes removing horizontal portions of the conformal MTJ material to expose an IMD material surface and to expose a top surface of the pillar, while leaving a remaining portion of the MTJ stack surrounding and uniformly covering a radial surface of the pillar, such that the remaining portion forms a free standing cylindrical MTJ comprising a seed layer, a reference layer, a dielectric tunnel barrier layer and a free layer that are radially stacked. The method additionally includes forming a dielectric layer on the IMD material surface exposed by removing the horizontal portions, while leaving a radial surface of the free layer is exposed. The method further includes forming an outer conductive electrode on the dielectric layer, the outer conductive electrode extending in the lateral direction and contacting the exposed radial surface of the free layer.

The conformal MTJ material stack can be formed by forming a conformal seed layer comprising a conductive material uniformly covering the intermetal dielectric material and uniformly covering the exposed portion of the pillar above the intermetal dielectric (IMD) material, forming a conformal and uniform reference layer of a ferromagnetic material on the seed layer, forming a conformal and uniform dielectric tunnel barrier layer on the reference layer, and forming a conformal and uniform free layer of a ferromagnetic material on the insulating layer.

In another aspect, a method of fabricating a magnetic tunnel junction (MTJ) device includes providing a bottom electrode buried in an intermetal dielectric (IMD) material, where the bottom electrode extending in a lateral direction, and forming an outer conductive electrode on the IMD material. The method additionally includes forming a via through the outer conductive electrode and stopping on the IMD material. The method additionally includes forming a magnetic tunnel junction (MTJ) stack on a cylindrical sidewall of the via such that the MTJ stack surrounds a cavity having a bottom surface comprising an exposed IMD material, the MTJ stack comprising a free layer, a dielectric tunnel barrier and a reference layer. The method additionally includes removing the exposed IMD material from the bottom surface to expose the bottom electrode. The method further includes forming an inner conductive electrode comprising a pillar contacting the bottom electrode by filling the cavity with a conductive material.

The MTJ stack can be formed by forming a first cavity comprising the free layer comprising a ferromagnetic material formed on a cylindrical sidewall of the via, forming a second cavity comprising the dielectric tunnel barrier formed on a cylindrical sidewall of the first cavity, and forming the cavity comprising the reference layer formed on a cylindrical sidewall of the second cavity.

In another aspect, a method of fabricating a magnetic tunnel junction device comprises: providing a layer of intermetal dielectric material on a bottom electrode; forming a vertical inner electrode of conductive material through the intermetal dielectric material extending from the bottom electrode; forming a seed layer of conductive material conformal along and around the vertical inner electrode and on the intermetal dielectric material; forming a reference layer of ferromagnetic material conformal along and around the seed layer; forming an insulating layer conformal along and around the reference layer; forming a free layer of ferromagnetic material conformal along and around the insulating layer; removing part of the seed layer, the reference layer, the insulating layer and the free layer being aside of the inner electrode, which is present on the intermetal dielectric material, and leaving other part of the seed layer, the reference layer, the insulating layer and the free layer located in a vertical direction extending from the intermetal dielectric layer intact; forming a dielectric layer aside and on the remaining seed layer, reference layer, insulating layer, free layer and inner electrode, leaving part of the free layer exposed; forming an outer electrode of conductive material aside of and in contact with the exposed free layer.

With forming a layer conformal along and around another layer the following is meant. For another layer extending in a vertical direction from the substrate (such as the inner electrode 204), a layer formed conformal along and around the another layer means that the layer is formed along the top and the sidewalls of the another layer and the layer is also formed on the material which may be present aside of the another layer. Conformal is thus following the geometry of the present layers which are exposed. For this invention this means the layer is formed in a horizontal direction (part of the layer is formed on the intermetal dielectric layer and a top of another layer) and in a vertical direction (part of the layer is formed along the vertical sidewalls of another layer).

According to embodiments the formation of the different layers (free layer, reference layer, seed layers, insulating layer) is done using atomic layer deposition (ALD).

According to embodiments the magnetic tunnel junction device is connected to a transistor via a drain contact between the transistor and the bottom electrode.

In yet another aspect, a method of fabricating a magnetic tunnel junction device comprises: forming an outer electrode of conductive material on an intermetal dielectric layer, the intermetal dielectric layer formed on a bottom electrode; forming a trench through the conductive layer thereby exposing the intermetal dielectric layer; depositing a free layer along the sidewalls of the trench leaving a first cavity and leaving part of the intermetal dielectric layer exposed; depositing in the first cavity an insulating layer aside of the free layer leaving a second cavity and leaving part of the intermetal dielectric layer exposed; depositing in the second cavity a reference layer aside of the insulating layer leaving a third cavity and leaving part of the intermetal dielectric layer exposed; removing in the third cavity part of the intermetal dielectric layer thereby exposing the bottom electrode; forming an inner electrode on the bottom electrode.

According to embodiments the steps of depositing the free layer comprises depositing the free layer conformal along the sidewalls and bottom surface of the trench and thereafter removing bottom part of the free layer.

According to embodiments the steps of depositing the insulating layer comprises depositing the insulating layer conformal along the sidewalls and bottom surface of first cavity and thereafter removing bottom part of the insulating layer.

According to embodiments the steps of depositing the reference layer comprises depositing the reference layer conformal along the sidewalls and bottom surface of second cavity and thereafter removing bottom part of the reference layer.

According to embodiments the magnetic tunnel junction device is connected to a transistor via a drain contact between the transistor and the bottom electrode.

It is an advantage of inventive aspects that the MTJ cell manufactured by the method according to embodiments of the present invention permits adequate magnetic volume to stabilize the memory bit against thermal agitation.

BRIEF DESCRIPTION OF THE DRAWINGS

The disclosure will be further elucidated by the following description and the appended figures.

FIG. 1B is a schematic top-down view of the magnetic memory device of FIG. 1A.

DETAILED DESCRIPTION OF CERTAIN ILLUSTRATIVE EMBODIMENTS

Figure 1A:
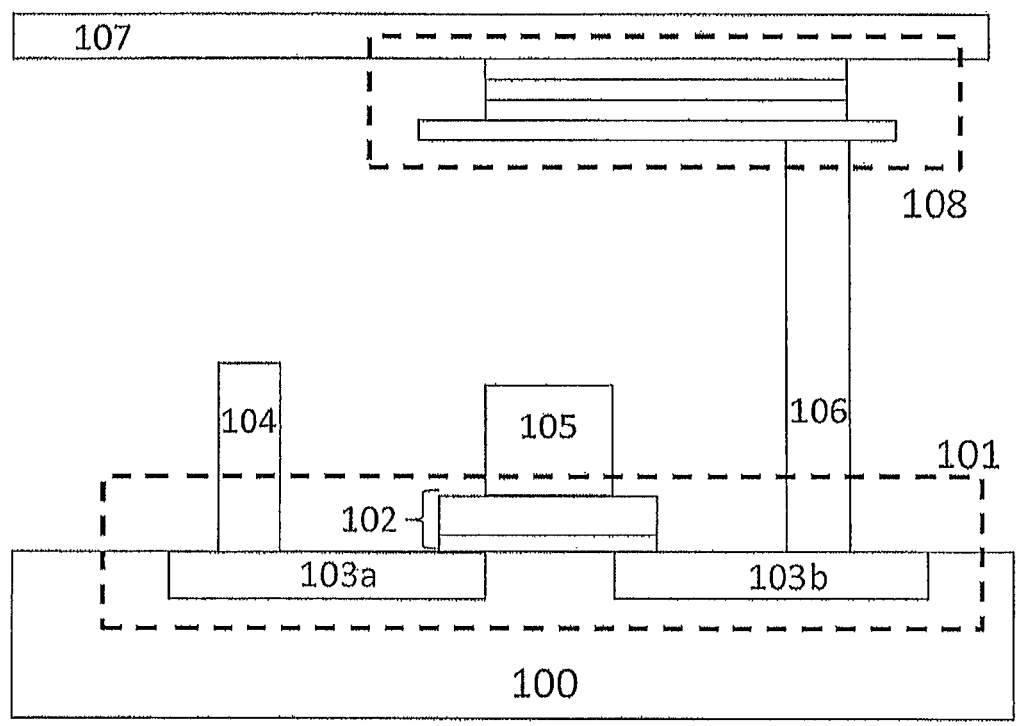
FIG. 1A is a schematic cross-sectional representation of a magnetic memory device.

The disclosure will be further elucidated by the following description and the appended figures.

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

The term "comprising", used in the claims, should not be interpreted as being restricted to the features listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

The disclosed technology will now be described by a detailed description of certain inventive embodiments.

The disclosed technology generally relates to a magnetic memory device, and more particularly related to spin-transfer torque random access memory (STT-RAM) devices. A STT-RAM device includes a magnetic tunneling junction (MTJ) element. The MTJ element comprises a tunnel barrier layer interposed between a reference layer and a free layer. The reference layer is often also referred to as the fixed layer or the pinned layer or the hard magnetic layer. The free layer is often also referred to as the storage layer or the pinning layer or the soft magnetic layer. In the disclosed STT memory devices, an electric current is polarized by aligning the spin direction of the electrons flowing through the magnetic tunnel junction (MTJ) element. Data writing, or switching, is performed in STT memory devices by using the spin-polarized current to change the magnetic orientation of the free layer in the MTJ element. The change in magnetic orientation in turn causes a corresponding change in the resistance of the MTJ element, and the difference in resistance states of the MTJ can be used to represent programmed and erased states of the memory cell.

The disclosed technology also relates to STT-MRAM devices having improved thermal stability and nonvolatility. Generally, the size of a memory cell of STT-MRAM devices scales down with advances in semiconductor technology. As the size of the memory cell scales, several technological challenges arise, including maintaining adequate thermal stability and nonvolatility of the stored information. The thermal stability of an STT-MRAM cell is generally proportional to the magnetic volume of the free layer of MTJ. Without being bound to any theory, a bit thermal stability factor of STT-MRAM cell can be represented as $\Delta=KAt/kT$, where K is the magnetic anisotropy, A the area of the magnetic free layer, t the film thickness of the magnetic free layer, k the Boltzman constant, T the temperature. Thus, the thermal stability $\Delta$ degrades proportionally with decreasing volume of the magnetic free layer. For the STT-MRAM memory cell to meet certain requirement, e.g., 10-year data retention, $\Delta$ in the range of 60 to 70 is desired.

FIG. 1A shows a schematic representation magnetic memory device comprising a transistor 101 and a MTJ cell 108. The transistor 101 is formed on a substrate 100 and comprises source/drain regions 103a and103b and a gate stack 102. The gate stack 102 is connected to a wordline 105, whereas the drain region 103b is connected to the MTJ cell 108 via a metal line drain contact 106. The source region also has a source contact 104. The MTJ cell 108 is connected to a bitline 107. The MTJ cell 108 comprises an insulating layer sandwiched in between a reference layer and a free layer, and all three layers are formed in a horizontal plane, which can be the wafer plane. From a top view as shown in FIG. 1B, the circular disk shape of the MTJ cell 108 is seen with the bitline 107 and wordline 105 running perpendicular to each other.

As the semiconductor technology advances, the area of the MTJ cell decreases. To maintain the thermal stability of memory cell against the reduction of cell area, either or both of the anisotropy K or/and the film thickness t can be conceptually increased to compensate the loss of magnetic volume, according the equation $\Delta=KAt/kT$ as described above. But these methods are not practically effective because the anisotropy K, which is related to the magnetic film-MgO interface, is expected to remain a constant for a given MTJ junction, independent of the technology node. In addition, increasing the free layer thickness is practically ineffective because $\Delta$ decreases proportionally to the area of the free layer, which decreases much faster with scaling. Thus, there is a need for an MTJ cell configuration in which the volume of the free layer can be maintained or increased by increasing the area of the free layer.

Figure 2:
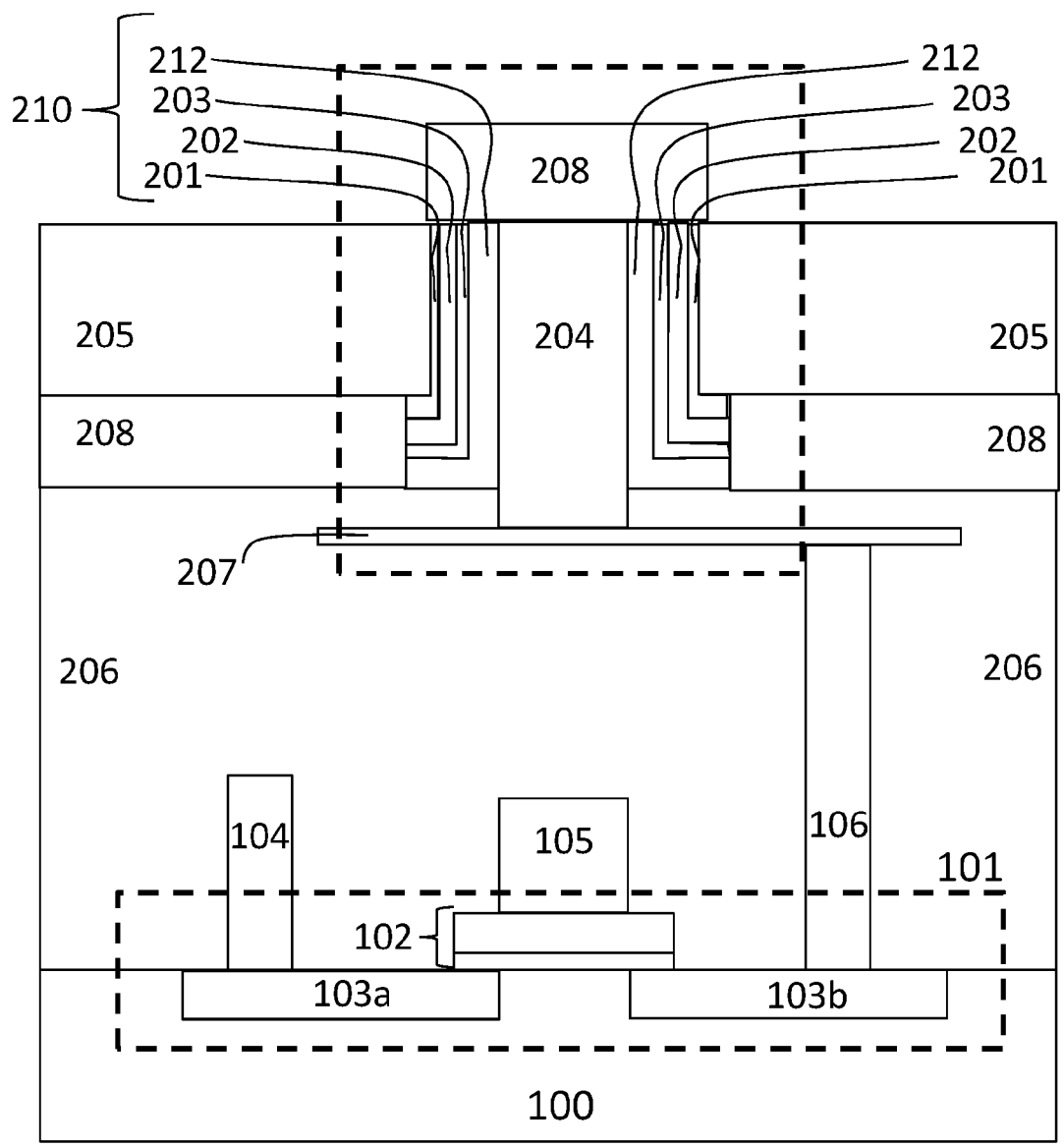
FIG. 2 is a schematic cross-sectional representation of a magnetic memory device according to embodiments of a first inventive aspect.

According to various embodiments described herein, an MTJ cell is fabricated via a conformal deposition techniques such as, for example, atomic layer deposition (ALD) method to form an MTJ cell stack having a ring structure or a shell structure that can be elongated in a vertical direction (perpendicular to the wafer plane) and electrically contacting an outer electrode (which can be, e.g., a bitline of the device) and contacting an inner electrode (which can be connected, e.g., to the drain of the access transistor), as shown in FIG. 2. The inventors have found that such ring structure or shell structure is very stable against thermal agitation since it is free of uncompensated magnetization poles, compared to MTJ structures similar to those described in FIGS. 1A and 1B.

In addition, the magnetic volume can advantageously be freely increased along the direction perpendicular to the wafer plane, essentially making this MRAM cell design a three dimensional cell structure. This eliminates the constraint of thermal stability constant reduction from small cell dimensions at advanced technology nodes.

FIG. 2 illustrates an exemplary magnetic memory device according to embodiments of a first inventive aspect. The magnetic memory device includes a transistor similar to the transistor 101 described above with respect to FIG. 1A. The transistor 101 includes a word line 105 connected to the gate stack 102 and with source/drain regions 103a/103b wherein the drain region 103b is connected to the magnetic tunnel junction device via a drain contact 106. According to a first inventive aspect the magnetic memory device includes a conductive inner electrode 204 comprising a pillar formed over a substrate 100 and elongated in a vertical direction perpendicular to the lateral surface of the substrate 100. The memory device additionally includes an outer electrode 205 extending in a lateral direction crossing the first direction, and the outer electrode 205 intersects the inner electrode 204. The memory device additionally includes a magnetic tunnel junction (MTJ) element formed at an intersection between the inner electrode 204 and the outer electrode 205, wherein the MTJ element continuously surrounds the inner electrode 204. The MTJ element comprises a stack 210 including a seed layer 212 continuously surrounding the pillar of the inner electrode 204, a reference layer 203 continuously surrounding the pillar of the inner electrode 204 and the seed layer 212, and a free layer 201 continuously surrounding the reference layer 203. The stack 210 further comprises a dielectric tunnel barrier 202 interposed between the reference layer 203 and the free layer 201.

The MTJ element of FIG. 2 is configured to tunnel spin-polarized electrons from the reference layer 203 through the dielectric tunnel barrier 202 to the free layer 201 to cause a change in the magnetic orientation of the free layer 201. Without being bound to theory, by polarizing the current, data is passed from the reference layer 203 that is the polarizer to the free layer 201. This process is called spin-transfer torque switching (STS). That is, the reference layer 203, sometimes called the "pinned" layer, functions as a spin filter, and the spin-filtered electrons tunneling through the dielectric tunnel barrier 202 causes spin transfer torque switching (STS) of the free layer 201 such that the MTJ's state from antiparallel or "1" to parallel or "0". Conversely, the MTJ's state can be changed from parallel "0" to antiparallel "1" in response to electrons tunneling in the opposite direction from the free layer 201 to the reference layer 203. Using the transistor 101 as a selection device, an STT-MRAM chip can address each bit (i.e., the MTJ) individually by flowing current directly through the bit.

Still referring to FIG. 2, in the illustrated embodiment, the memory device further includes a bottom electrode 207 extending in the lateral direction and having the inner electrode 204 formed thereon. The bottom electrode 207 extends so as to at least partially laterally overlap the transistor 101 such that the pillar and the surrounding MTJ element, at least partially, laterally overlap the transistor 101. Thus, the overall lateral footprint of the memory cell can be minimized.

Still referring to FIG. 2, the conductive outer electrode 205 is separated from the bottom electrode 207 by an intermetal dielectric layer 206 and a dielectric layer 208 which provide electrical isolation between the outer electrode 205 and the inner electrode 204.

Thus, the MTJ element includes a cylindrical magnetic tunnel junction formed between the outer electrode 205 and the inner electrode 204, the cylindrical magnetic tunnel junction including a dielectric tunnel barrier 202 sandwiched in between a free layer 201 and a reference layer 203 and a seed layer 212 wherein the free layer 201 is a cylindrical layer in physical contact with the outer electrode 205 and the seed layer 212 is a cylindrical layer in physical contact with the inner electrode 204.

As described above, each one of the seed layer 212, the reference layer 203, dielectric tunnel barrier 202 and the free layer 201 can be formed using a conformal deposition technique such as atomic layer deposition or some chemical vapor deposition techniques (e.g., subatmospheric chemical vapor deposition). In these embodiments, the seed layer 212 has a uniform thickness and conformally surrounds the pillar of the inner electrode 204, the reference layer 203 has a uniform thickness and conformally surrounds the pillar of the inner electrode 204 and the seed layer 212, the dielectric tunnel barrier 202 has a uniform thickness and conformally surrounds the reference layer 203, and the free layer 201 has a uniform thickness and conformally surrounds the dielectric tunnel barrier 202.

Figure 12:
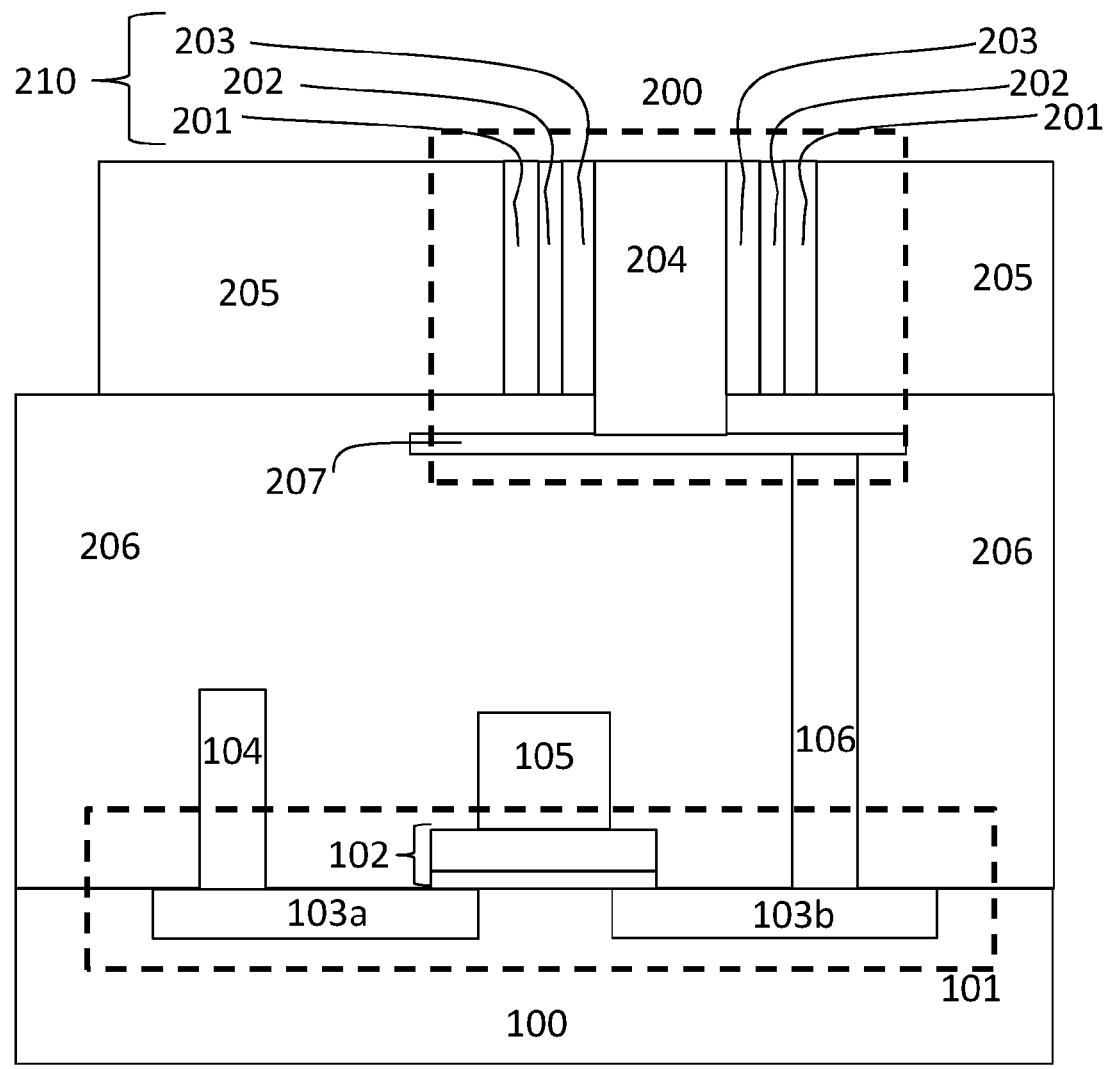
FIG. 12 is a schematic cross-sectional representation of a magnetic memory device according to embodiments of a second inventive aspect.

An exemplary magnetic memory device according to embodiments of a second inventive aspect is shown in FIG. 12. The magnetic memory device of FIG. 12 includes a transistor similar to the transistor 101 of FIG. 1A, including a word line 105 connected to the gate stack 102 and with source/drain regions 103a, 103b, wherein the drain region 103b is connected to the magnetic tunnel junction device via drain contact 106. The memory device of FIG. 12 is similar to the memory device of FIG. 2 and includes a conductive inner electrode 204 comprising a pillar formed over a substrate 100 and elongated in a vertical direction perpendicular to the lateral surface of the substrate 100. The memory device additionally includes an outer electrode 205 extending in a lateral direction crossing the first direction, and the outer electrode 205 intersects the inner electrode 204. The memory device additionally includes a magnetic tunnel junction (MTJ) element formed at an intersection between the inner electrode 204 and the outer electrode 205, wherein the MTJ element continuously surrounds the inner electrode 204.

Unlike the MTJ element of FIG. 1, however, the MTJ element 200 of FIG. 12 does not have the seed layer 212. Thus, MTJ element 200 of FIG. 12 includes a stack 210 including a reference layer 203 directly surrounding the pillar of the inner electrode 204, and a free layer 201 continuously surrounding the reference layer 203. The stack 210 further includes a dielectric tunnel barrier 202 interposed between the reference layer 203 and the free layer 201.

In addition, unlike FIG. 2, the conductive outer electrode 205 of FIG. 12 separated from the bottom electrode 207 by an intermetal dielectric layer 206 without being further separated by another dielectric layer in providing the electrical isolation between the outer electrode 205 and the inner electrode 204.

Thus, according to the second inventive aspect the magnetic tunnel junction element 200 comprises a cylindrical magnetic tunnel junction 210 formed between the outer electrode 205 and the inner electrode 204, the cylindrical magnetic tunnel junction 210 comprising a dielectric tunnel barrier 202 sandwiched in between a free layer 201 and a reference layer 203, the free layer 201 being a cylindrical layer in physical contact with the outer electrode 205 and the reference layer 203 being a cylindrical layer in physical contact with the inner electrode 204.

According to various embodiments, the inner electrode 204 and the outer electrode 205 may be formed of a conductive material such as a metal material or metal compound. The inner electrode 204 and the outer electrode 205 may comprise metals such as Ti, Ta, Pt, Cu, W, Al, Au, Ag, Rh and Ru, among others, and alloys comprising the metals, such as TiN, TaN and WSi, among others. The inner electrode 204 and the outer electrode 205 can be formed of the same conductive material.

According to embodiments the free layer 201 and the reference layer 203 may be formed of a ferromagnetic material such as Fe, Co, Ni and their alloys like but not limited to CoFe, NiFe, CoFeNi, CoFeB, CoZrTa, CoZrNr, FeN, CoFeN, and CoFeAl, among other ferromagnetic materials.

According to various embodiments, the dielectric tunnel barrier 202, which is a tunneling insulating layer, in between the free layer 201 and the reference layer 203, may be formed of dielectric material like but not limited to oxides and nitrides including, for example, MgO, $Al_2O_3$, $SiO_2$, $TiO_2$, $Ta_2O_5$ and $HfO_2$, among others.

Thickness of the free layer, the reference layer and the insulating layer may be very thin as ALD deposition is used. The thickness of each of the layers may range from 0.5 nm to 5 nm. The magnetic tunnel junction may have a total thickness in a range of from 4 nm to 20 nm.

According to certain embodiments, a seed layer is also formed using ALD.

Figure 3:
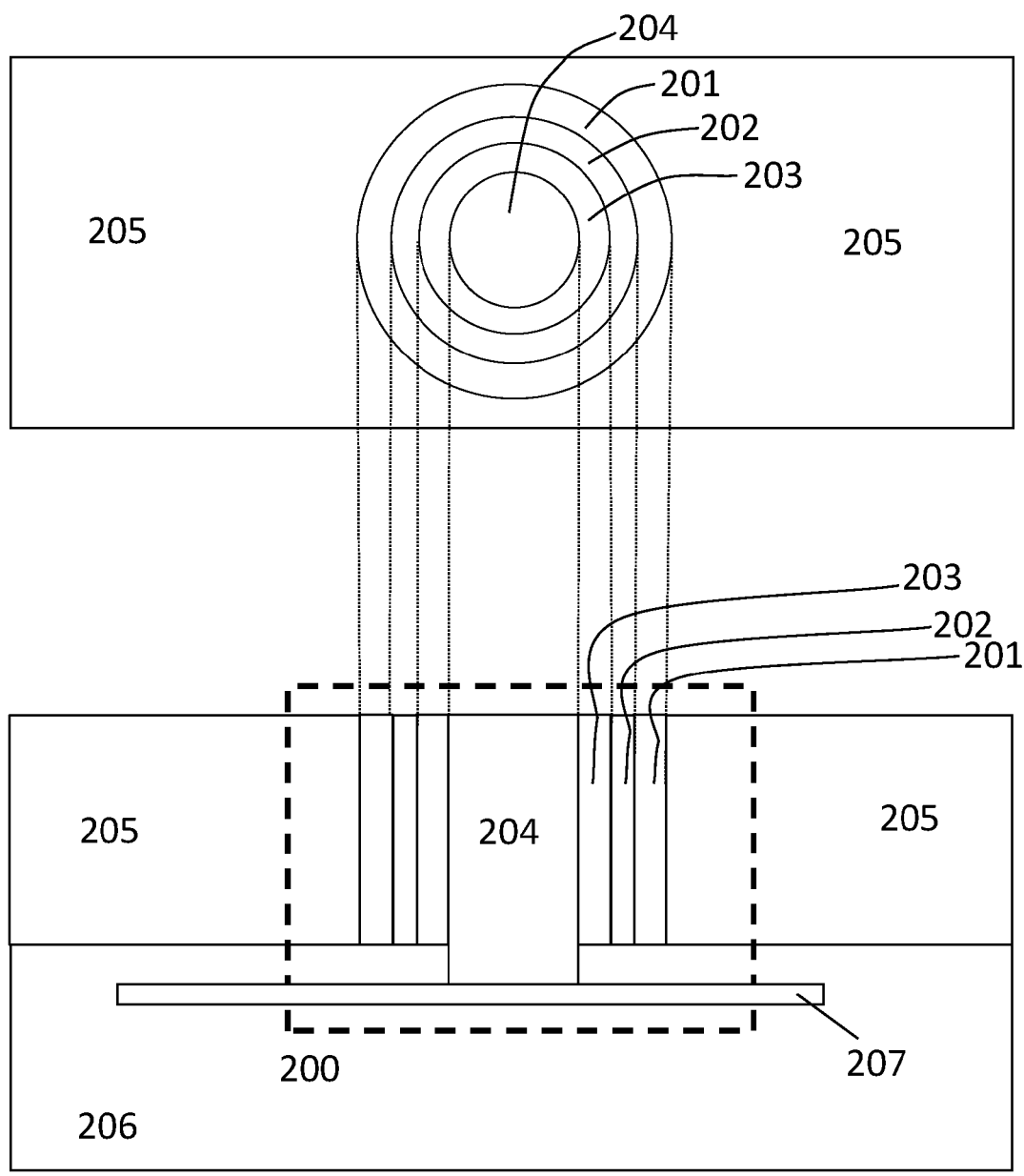
FIG. 3 is schematic cross-sectional and top-down representations of a magnetic tunnel junction device according to embodiments of a second inventive aspect.

FIG. 3 shows a side view and (bottom) and a top view (top) of a magnetic tunnel junction cell according to embodiments of the second inventive aspect. From top view, the circular shape of the different layers of the magnetic tunnel junction is clearly visible.

It will be appreciated that alternative configurations to those illustrated in FIGS. 2, 12 and 3 are possible. For example, instead of having an inner electrode connected to the drain of the select transistor to receive electrons therefrom, an outer electrode may be connected to the drain of the select transistor.

It will be further appreciated that the particular stacking sequence of the stacks 210 of FIGS. 2, 3 and 12 can maximize the thermal stability of the free layer 201 because by being on the outer portion of the cylindrical MTJ, the volume of the free layer 201 is maximized. However, it will further be appreciated that the stacking sequence of the MTJ may be reversed in alternative embodiments. For example, instead of having the seed layer 212 and the reference layer 203 formed on the inner electrode 204 and having the free layer 201 formed on the outer electrode in FIG. 2, the order of the stack may be reversed such that the free layer 201 is formed on the inner electrode 204 and the seed layer 212 and the reference layer 203 are formed on the outer electrode 205. Similar modifications can be made to the stack 210 of FIG. 12.

To realize the 3D-STT-MRAM designs illustrated in FIGS. 2, 3 and 12, the MTJ can be formed by utilizing a conformal deposition technique such as atomic layer deposition (ALD) as discussed above, and pattern the MTJ junction. It will be appreciated that the MTJ elements of FIGS. 2, 3 and 12 can be configured to have one of two different geometries, one with magnetization in plane and another with magnetization out-of-plane (perpendicular). In some embodiments, the MTJ element is an in-plane MTJ element having a direction of anisotropy extending in the direction that is tangentially parallel to the cylindrical surface of the free layer. In some other embodiments, the MTJ is a perpendicular MTJ having radially symmetric directions of anisotropy that are perpendicular to a cylindrical surface of the free layer. The magnetization of the ring-shaped or shell-shaped MTJ elements can have the magnetization in circumferentially tangential directions to the cylindrical surface of the MTJ elements, thereby obviating the need for perpendicular anisotropy, which can demand more stringent processes requirements. However, the disclosed technology is equally compatible with out-of-plane MTJ configurations. In embodiments having out-of-plane MTJ, the MTJ stack structure comprises a stack including CoFeB in one or both of the free layer and the reference layer, for example, such as CoFeB/MgO/CoFeB in which a single layer of CoFeB having perpendicular magnetic anisotropy (PMA) can be used in both storage layer and reference layer.

Using the method according to embodiments of the present invention a 3D MTJ cell is formed thereby increasing the cell area A and as such the thermal stability $\Delta$ of the device.

FIGS. 4 to 10 illustrate the different steps for forming a magnetic tunnel junction device according to embodiments of a first inventive aspect.

Figure 4:
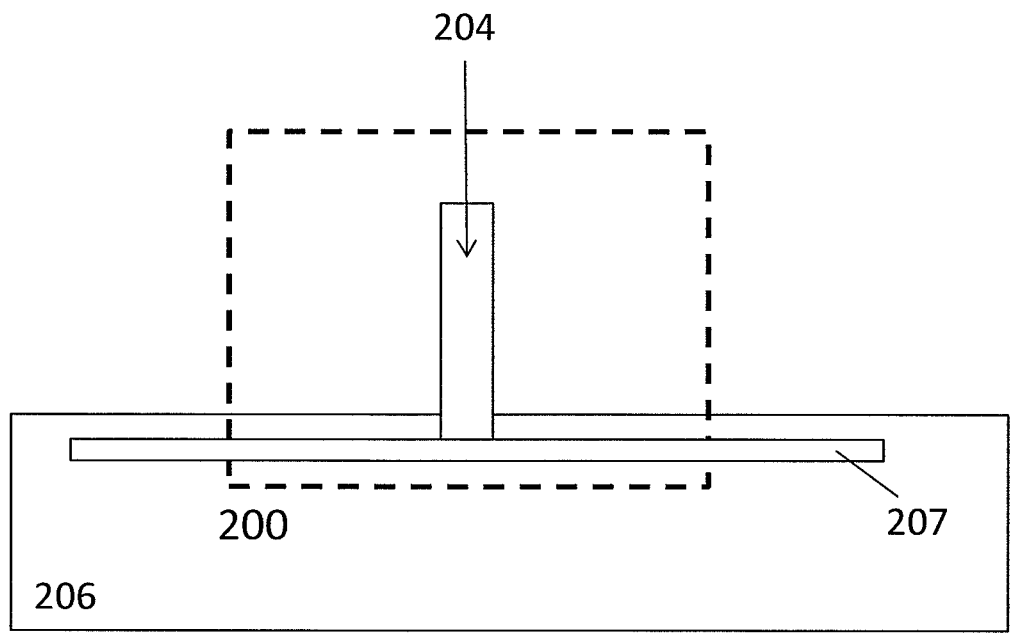
FIGS. 4-11 illustrate various stages of manufacturing a magnetic tunnel junction cell according to embodiments of a first inventive aspect.
Figure 5:
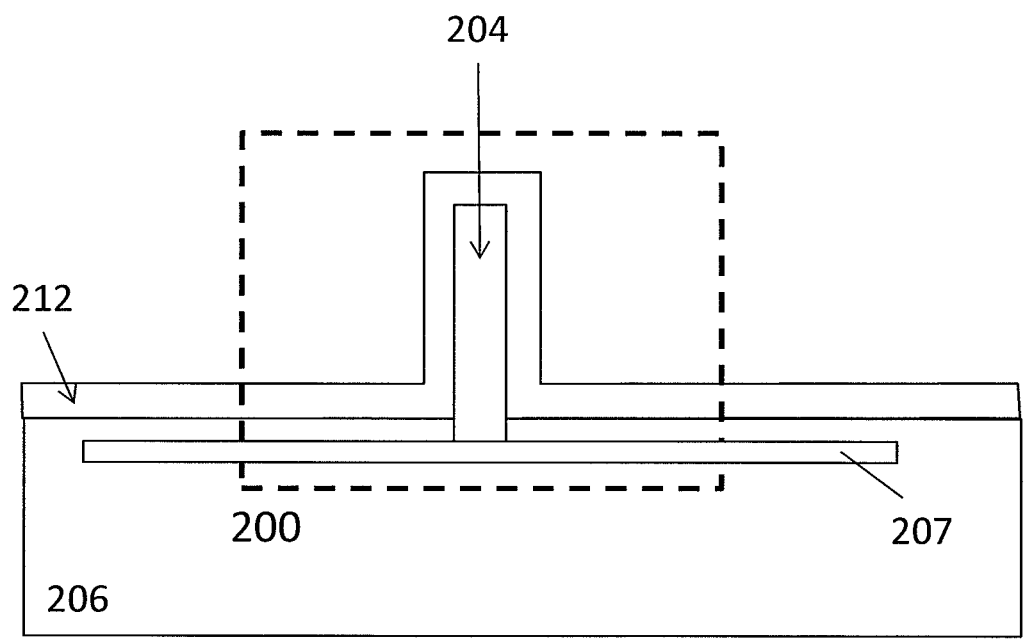
Figure 6:
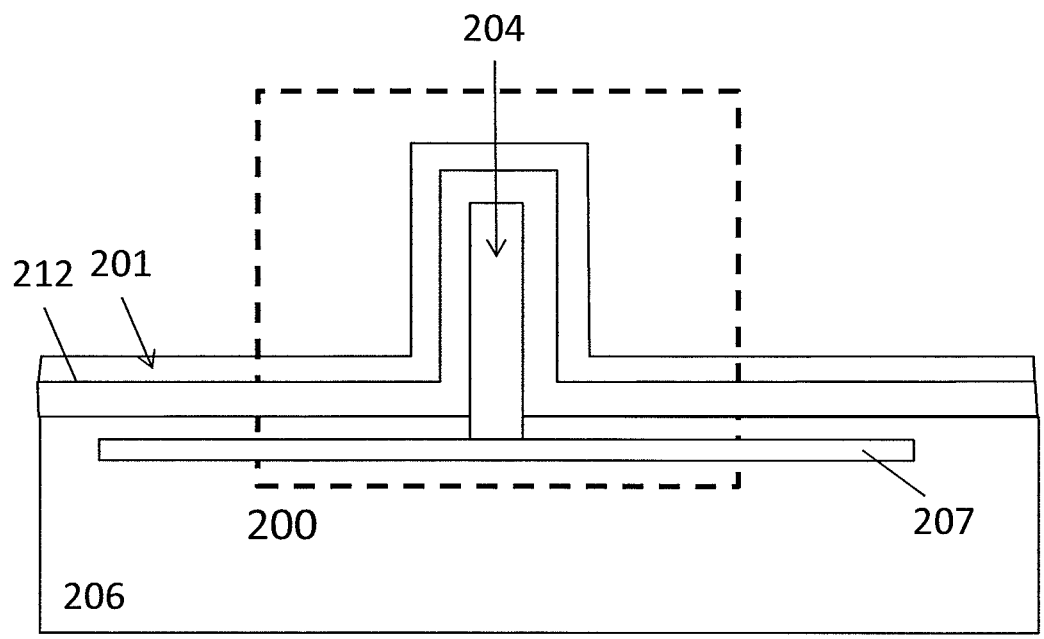
Figure 7:
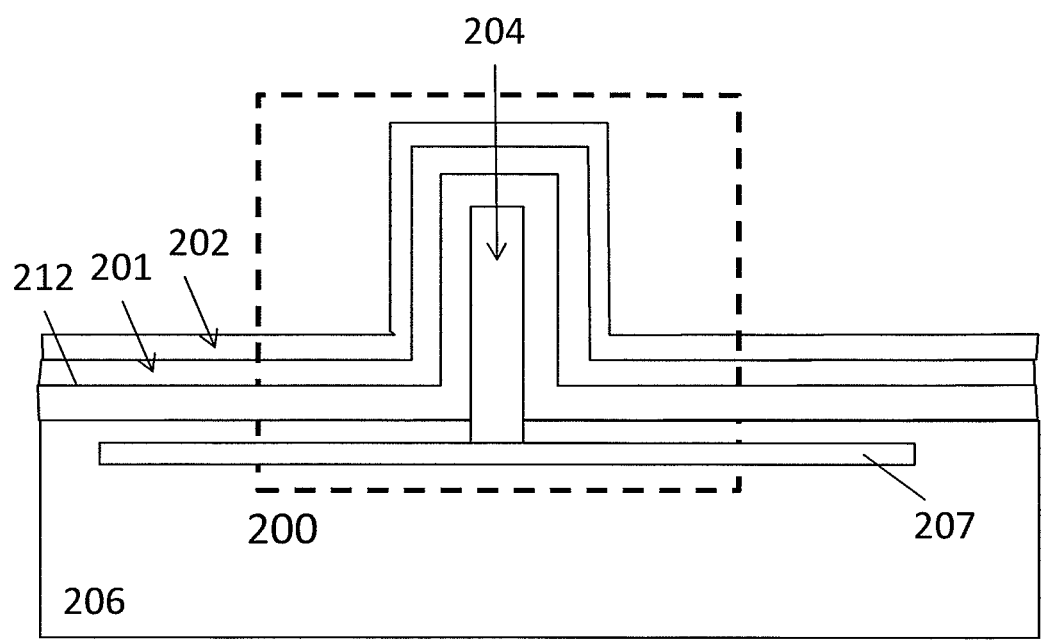
Figure 8:
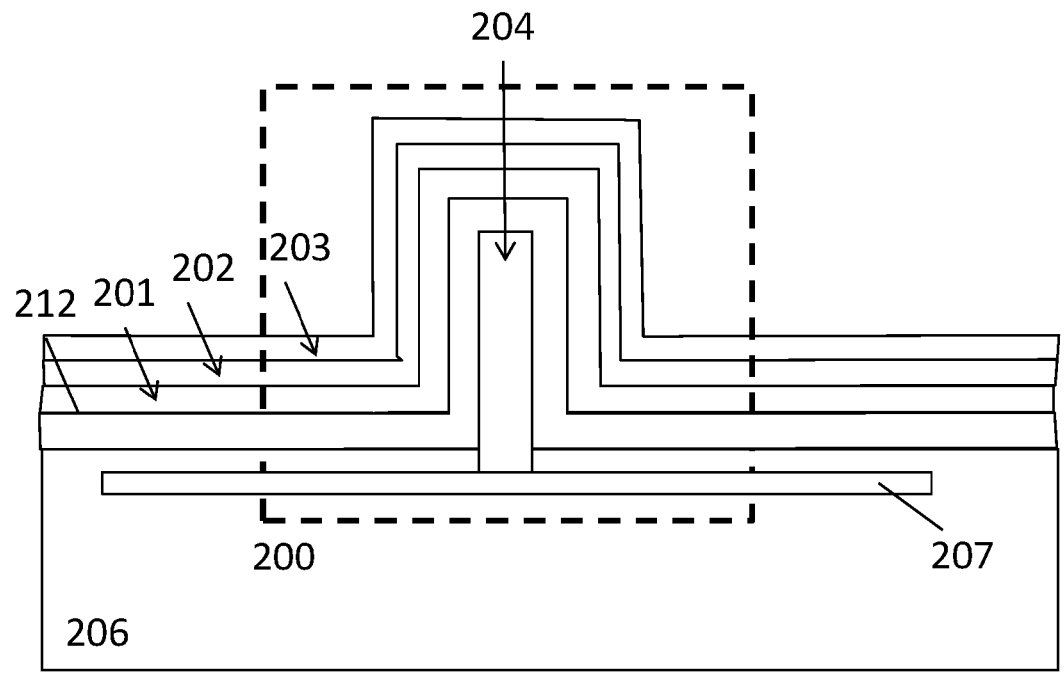
Figure 9:
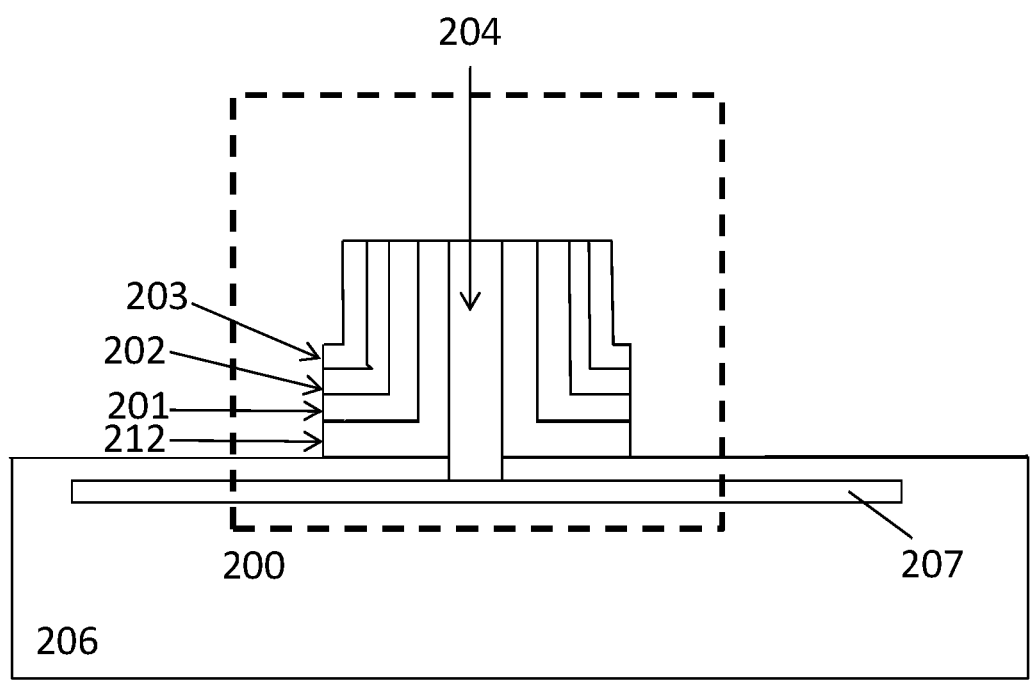
Figure 10:
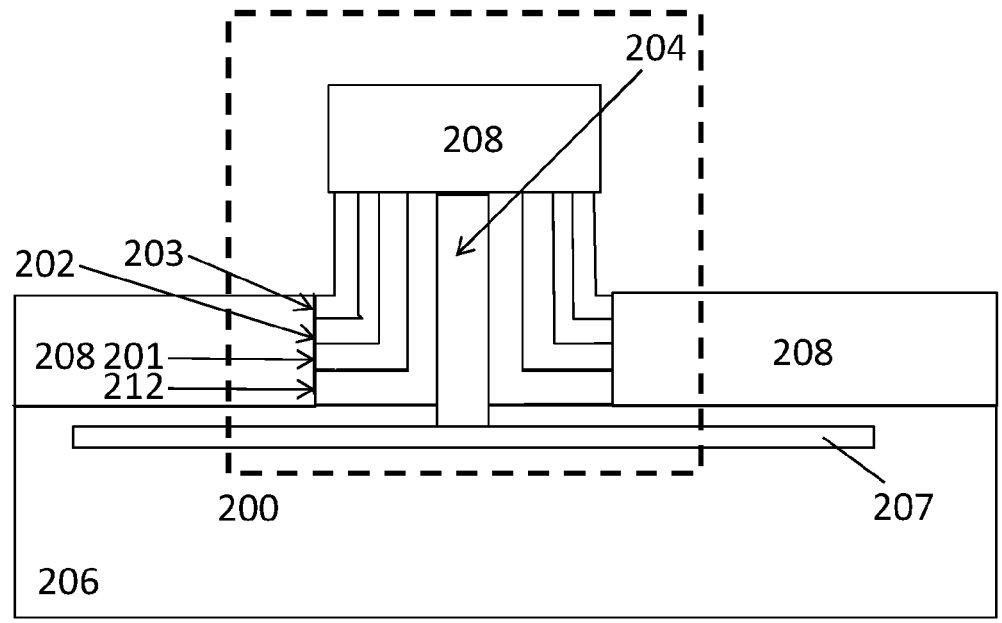
Figure 11:
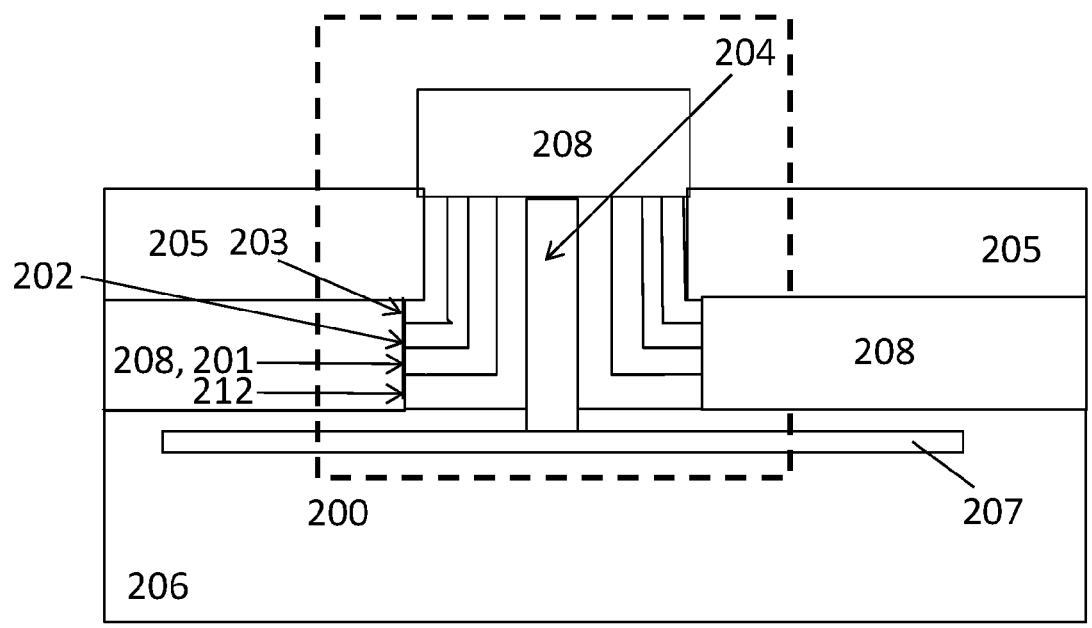

As shown in FIG. 4, a layer of intermetal dielectric material 206 is provided on a bottom electrode 207 and a vertical inner electrode of conductive material 204 is formed through the intermetal dielectric material 206 extending from the bottom electrode 207. Thereafter a seed layer of conductive material 212 is formed conformal along and around the vertical inner electrode 204 and on the intermetal dielectric material 206. This is preferably done using ALD. The same process step is repeated for the formation of a reference layer of ferromagnetic material 201 conformal along and around the seed layer (FIG. 6), the formation of a dielectric tunnel barrier 202 conformal along and around the reference layer 201 (FIG. 7), the formation of a free layer 203 of ferromagnetic material conformal along and around the dielectric tunnel barrier 202 (FIG. 8). Thereafter part of the seed layer 212, the reference layer 201, the dielectric tunnel barrier 202 and the free layer 203 which is present on the intermetal dielectric material 206 and being aside of the inner electrode 204 is removed, but leaving other part of the seed layer 212, the reference layer 203, the dielectric tunnel barrier 202 and the free layer 201 located in a vertical direction aside of the inner electrode 204 and extending from the intermetal dielectric layer 206 intact (FIG. 9). The removal is done using appropriate etching steps. Depending on the materials used for the different layers, removing may be done in 1 or several etching steps. A dielectric layer 208 is formed aside and on the remaining seed layer 212, reference layer 203, the dielectric tunnel barrier 202, free layer 201 and inner electrode 204, leaving part of the free layer 201 exposed (FIG. 10). On the dielectric layer 208 an outer electrode 205 of conductive material is formed (FIG. 11), which will thus also be present aside of and in contact with the exposed free layer 201.

FIGS. 13 to 20 illustrate the different steps for forming a magnetic tunnel junction device according to embodiments of a second inventive aspect.

Figure 13:
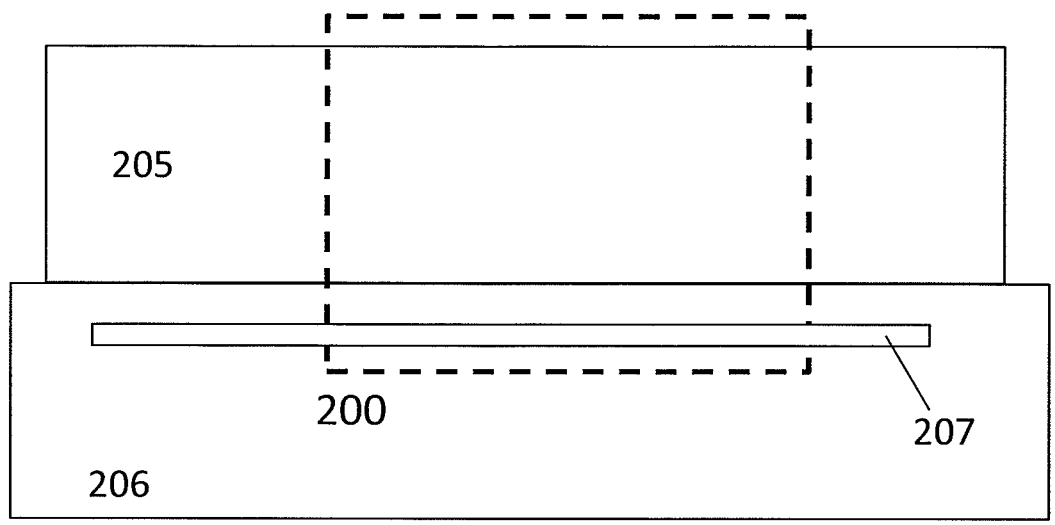
FIGS. 13-21 illustrate various stages of manufacturing a magnetic tunnel junction cell according to embodiments of a second inventive aspect.

A conductive layer 205 is formed on an intermetal dielectric layer 206. The intermetal dielectric layer 206 formed on a bottom electrode 207 (FIG. 13).

Thereafter openings or trenches are provided in the conductive layer. These are preferably with a cylindrical shape.

Figure 14:
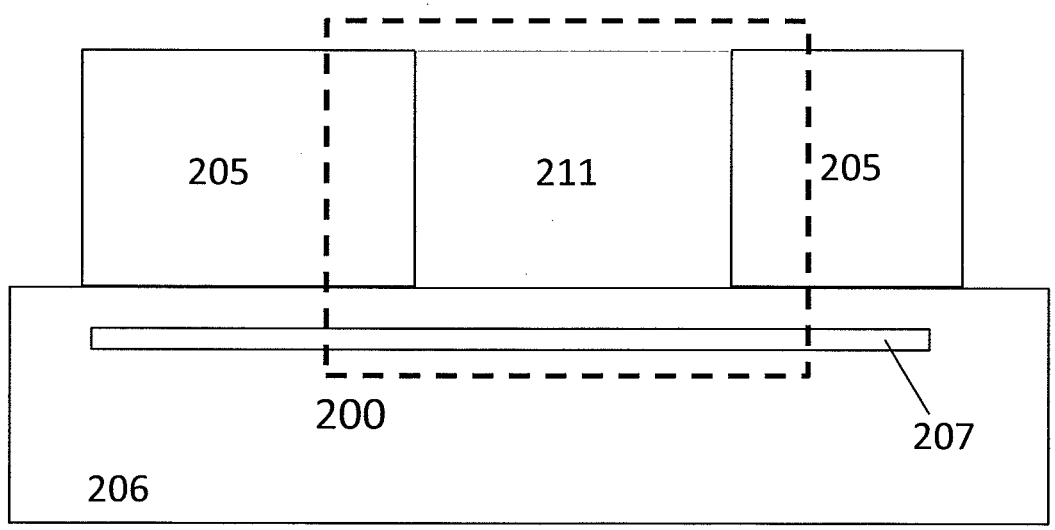
Figure 15:
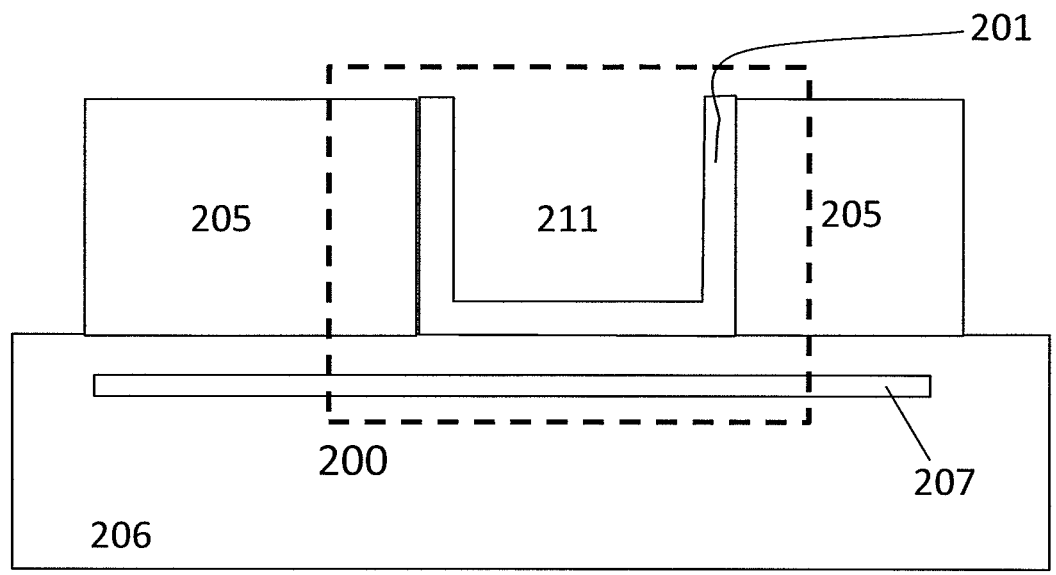
Figure 16:
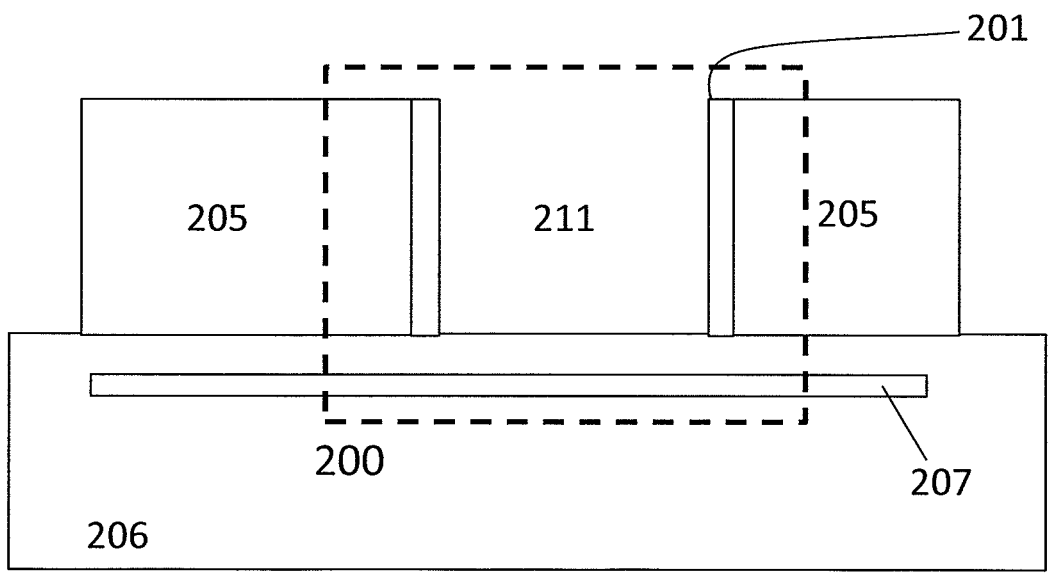
Figure 17:
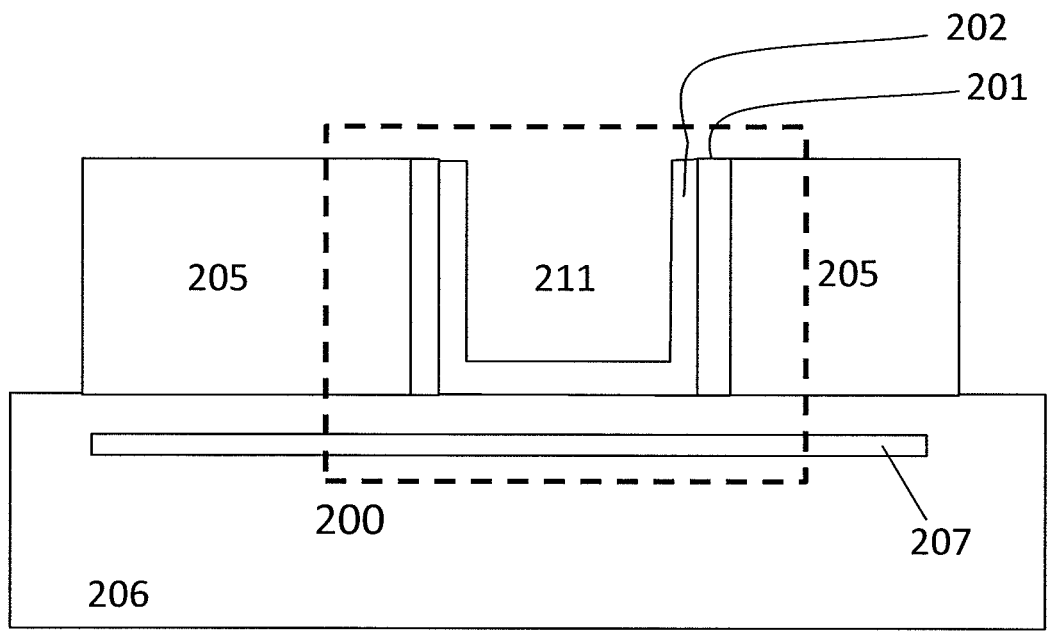
Figure 18:
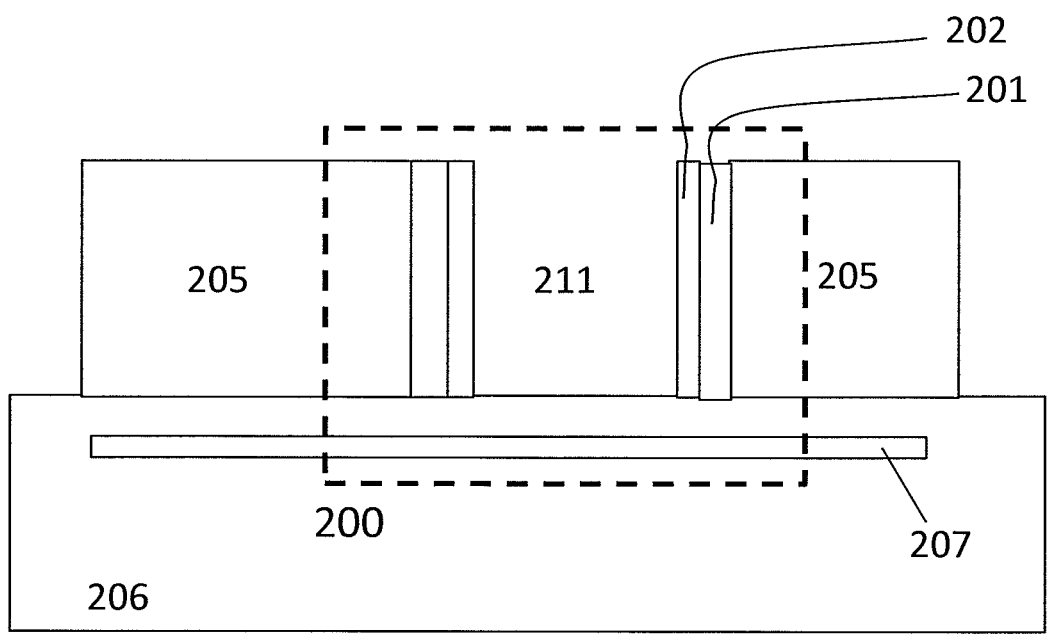

A trench 211 is formed through the conductive layer 205 thereby exposing the intermetal dielectric layer 206 (FIG. 14). The trench 211 has a pillar-like shape and removing of the conductive layer thereby forming the pillar-shaped trench may be done by etching.

In a following step, the free layer 201 of the magnetic tunnel junction is formed by depositing a layer of magnetic material using atomic layer deposition (ALD) on the sidewalls of the trench 211 and on the bottom surface, being the exposed part of the intermetal dielectric layer 206. The magnetic material layer is thus formed in conformal way along the trench. Thereafter part of the magnetic material layer on the dielectric layer is removed through an etching step, as the free layer in the final device may only be present at the sidewalls, i.e. in a vertical direction (perpendicular to the wafer plane/substrate).

Figure 19:
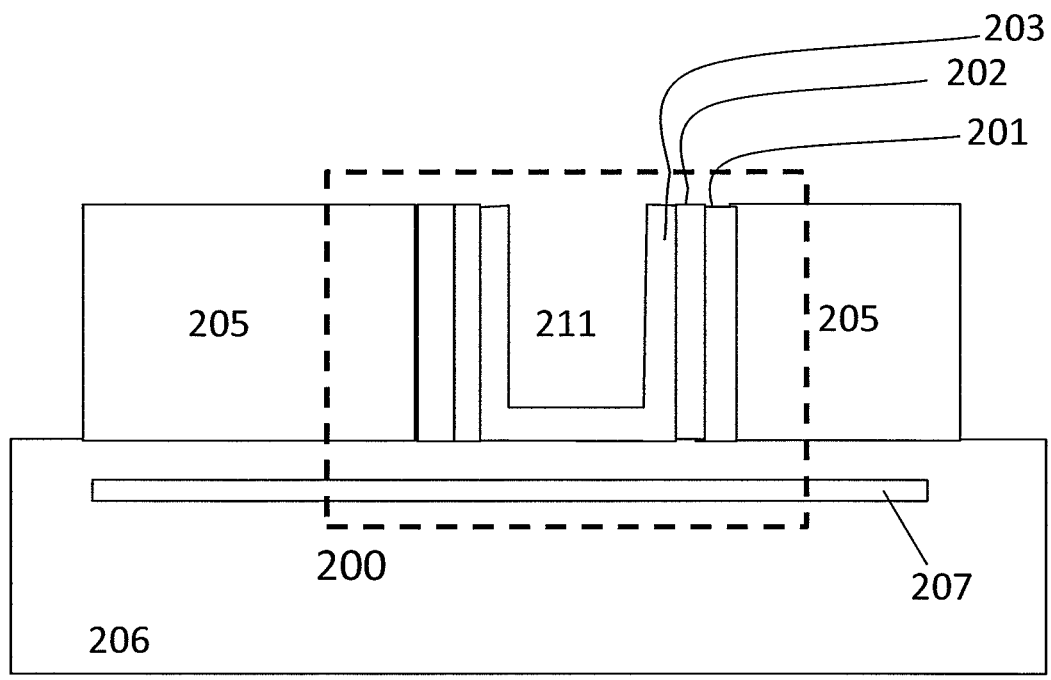
Figure 20:
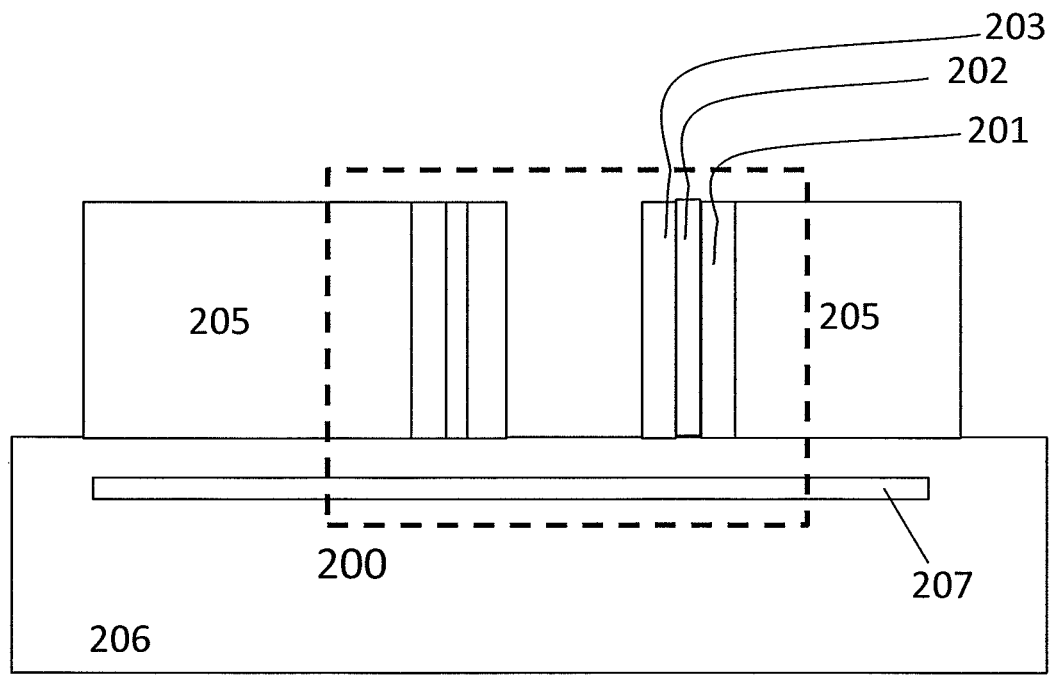

The same process is repeated for also forming the dielectric tunnel barrier 202 (FIGS. 17-18) and the reference layer 203 (FIGS. 19-20). The layers are formed with ALD in the remaining cavity and thereafter etched such that in the end device the layers are only present in a vertical direction, extending from the intermetal dielectric layer 206.

Figure 21:
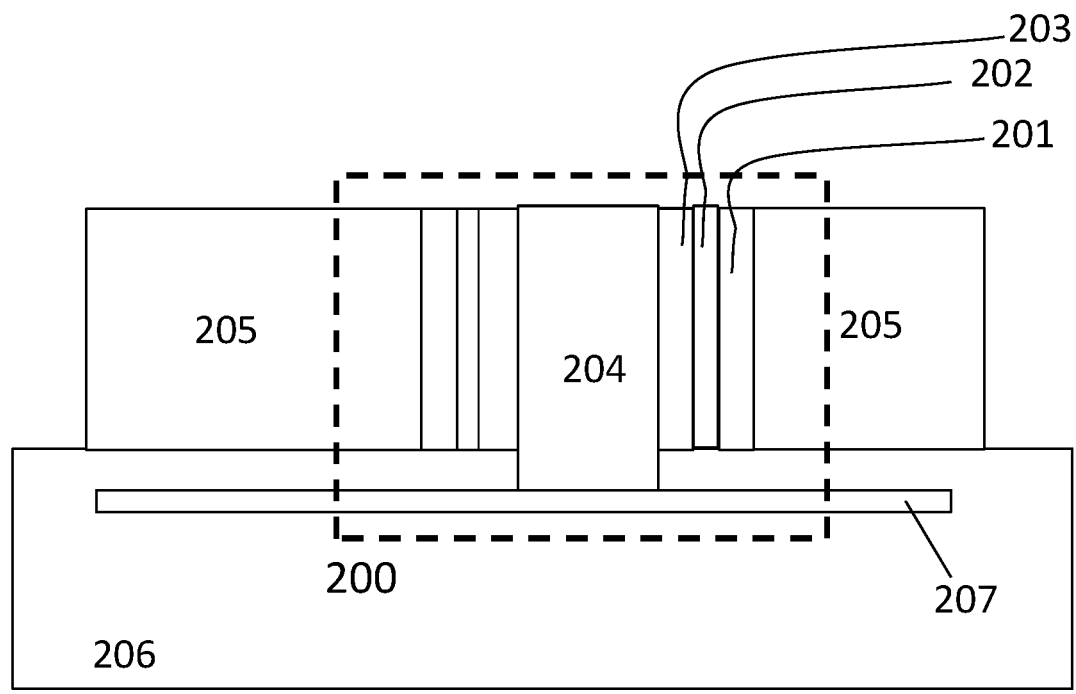

An inner electrode 204 is thereafter formed extending from the bottom electrode 207 (FIG. 21) in the remaining cavity.

Figure 22:
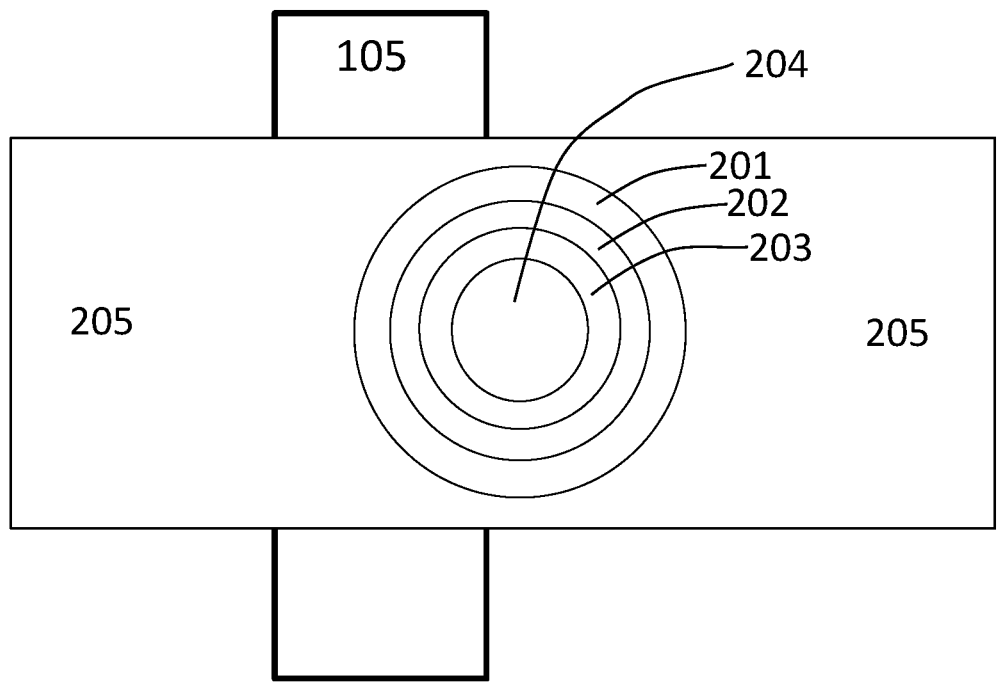
FIG. 22 is schematic cross-sectional and top-down representations of magnetic memory device according to embodiments.

FIG. 22 illustrates a schematic representation of magnetic memory device according to embodiments of the present invention in top view. The wordline 105 runs over the gate electrode as also shown in FIG. 1B. The bitline is the outer electrode 205 of the MTJ cell further comprising a dielectric tunnel barrier 202 sandwiched in between reference layer 203 and free layer 201.

The foregoing description details certain embodiments of the invention. It will be appreciated, however, that no matter how detailed the foregoing appears in text, the invention may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

What is claimed is:

1. A memory device, comprising:
    a semiconductor substrate;
    a first electrode comprising a conductive pillar formed over the semiconductor substrate and elongated in a vertical direction, the vertical direction crossing a lateral surface of the semiconductor substrate;
    a second electrode forming a line extending in a lateral direction crossing the vertical direction, the second electrode intersecting the first electrode; and
    a magnetic tunnel junction (MTJ) formed at an intersection between the first electrode and the second electrode, the MTJ continuously surrounding the first electrode and comprising:
        a reference layer continuously surrounding the conductive pillar of the first electrode,
        a free layer continuously surrounding the reference layer, and
        a dielectric tunnel barrier interposed between the reference layer and the free layer,
        wherein the MTJ is formed in a vertical opening formed within and through the second electrode such that the MTJ is surrounded by the second electrode, and
        wherein the MTJ is configured to radially tunnel spin-polarized electrons from the reference layer through the dielectric tunnel barrier to the free layer to cause a change in a magnetic orientation of the free layer.

2. The memory device of claim 1, further comprising a select transistor comprising:
    a gate electrode extending in a second lateral direction crossing the lateral direction; and
    a drain electrically connected to the first electrode and configured to supply electrons to the reference layer of the MTJ through the conductive pillar of the first electrode when the select transistor is switched on.

3. The memory device of claim 2,
    wherein the first electrode further comprises a bottom electrode extending in the lateral direction and having a first side having the conductive pillar formed thereon, and
    wherein the memory device further comprises:
        a drain contact having a first end electrically connected to the drain and a second end contacting a second side of the bottom electrode opposing the first side of the bottom electrode,
        wherein the bottom electrode extends laterally from a drain side towards a source side to at least partially laterally overlap the select transistor such that the conductive pillar and the surrounding MTJ at least partially laterally overlap the select transistor.

4. The memory device of claim 1, wherein the MTJ further comprises a seed layer interposed between and contacting the reference layer and the conductive pillar of the first electrode.

5. The memory device of claim 1, wherein:
    the reference layer has a uniform thickness and conformally surrounds the conductive pillar of the first electrode;
    the dielectric tunnel barrier has a uniform thickness and conformally surrounds the reference layer; and
    the free layer has a uniform thickness and conformally surrounds the dielectric tunnel barrier.

6. The memory device of claim 5, wherein the conductive pillar is a cylindrical pillar and the MTJ forms a cylindrical shell conformally and uniformly surrounding the cylindrical pillar.

7. The memory device of claim 6, wherein the MTJ is a perpendicular MTJ having radially symmetric directions of anisotropy that are perpendicular to a cylindrical surface of the free layer.

8. A three dimensional magnetic memory device, comprising:
    a semiconductor substrate;
    a conductive inner electrode comprising a cylindrical pillar formed on a bottom electrode and extending in a vertical direction, the vertical direction crossing a surface of the semiconductor substrate;
a conductive outer electrode extending in a lateral direction crossing the vertical direction and surrounding the conductive inner electrode, wherein the conductive outer electrode is vertically separated from the bottom electrode by an intermetal dielectric material; and
a cylindrical magnetic tunnel junction (MTJ) comprising a cylindrical shell structure extending in the vertical direction and radially interposed between the conductive outer electrode and the cylindrical pillar of the conductive inner electrode, the cylindrical MTJ comprising an insulating layer interposed between a free layer and a reference layer,
wherein the cylindrical MTJ is formed in a vertical opening formed within and through the conductive outer electrode such that the cylindrical MTJ is surrounded by the conductive outer electrode, and
wherein the free layer comprises a cylindrical layer contacting the conductive outer electrode, and wherein the cylindrical MTJ is vertically separated from the bottom electrode by the intermetal dielectric material.

9. The three dimensional magnetic memory device of claim 8, wherein the cylindrical MTJ further comprises a seed layer comprising a cylindrical layer having an inner surface contacting the cylindrical pillar of the conductive inner electrode and having an outer surface contacting the reference layer.

10. The three dimensional magnetic memory device of claim 8, wherein at least one of the reference layer and the free layer is formed of a ferromagnetic material.

11. The three dimensional magnetic memory device of claim 8, wherein the insulating layer comprises a dielectric tunnel barrier, wherein the cylindrical MTJ is configured to tunnel spin-polarized electrons from the reference layer through the dielectric tunnel barrier to the free layer to cause a change in a magnetic orientation of the free layer.

12. The three dimensional magnetic memory device of claim 11, wherein thicknesses of each of the reference layer, the free layer and the dielectric tunnel barrier range between about 0.5 nm and about 5 nm.

13. A method of fabricating a magnetic tunnel junction (MTJ) device, the method comprising:
providing a semiconductor substrate;
providing a bottom electrode extending in a lateral direction;
forming an intermetal dielectric (IMD) material on the bottom electrode;
forming a conductive vertical inner electrode comprising a conductive pillar elongated in a vertical direction, the vertical direction crossing a lateral surface of the semiconductor substrate, the conductive pillar contacting the bottom electrode and having an exposed portion extending above the IMD material, wherein the bottom electrode and the conductive vertical inner electrode serve as a first electrode of the MTJ device;
forming a free standing cylindrical MTJ surrounding the exposed portion of the conductive pillar, wherein the free standing cylindrical MTJ continuously surrounds the conductive pillar and comprises:
a reference layer continuously surrounding the conductive pillar of the first electrode,
a free layer continuously surrounding the reference layer, and
a dielectric tunnel barrier interposed between the reference layer and the free layer; and forming a second electrode extending in the lateral direction crossing the vertical direction, the second electrode intersecting the first electrode, forming the second electrode comprising forming an outer conductive electrode,
wherein the free standing cylindrical MTJ is formed in a vertical opening formed within and through the second electrode such that the free standing cylindrical MTJ is surrounded by the second electrode, and
wherein the free standing cylindrical MTJ is configured to radially tunnel spin-polarized electrons from the reference layer through the dielectric tunnel barrier to the free layer to cause a change in a magnetic orientation of the free layer.

14. The method of claim 13,
wherein forming the free standing cylindrical MTJ comprises:
forming a conformal magnetic tunnel junction (MTJ) material stack uniformly covering the IMD and the conductive pillar, the MTJ material stack including a seed material, a reference layer material, an insulating layer material and a free layer material, and
removing horizontal portions of the conformal MTJ material to expose an IMD material surface and to expose a top surface of the conductive pillar, while leaving a remaining portion of the MTJ material stack surrounding and uniformly covering a radial surface of the conductive pillar, such that the remaining portion forms the free standing cylindrical MTJ comprising the seed layer, the reference layer, the dielectric tunnel barrier and the free layer that are radially stacked.

15. The method of claim 14,
wherein forming the outer conductive electrode comprises:
forming a dielectric layer on the IMD material surface exposed by removing the horizontal portions of the conformal MTJ material, while leaving exposed a radial surface of the free layer; and
forming an outer conductive electrode on the dielectric layer, the outer conductive electrode extending in the lateral direction and contacting the exposed radial surface of the free layer.

16. The method of claim 15, wherein forming the conformal MTJ material stack comprises:
forming a conformal seed layer comprising a conductive material uniformly covering the intermetal dielectric material and uniformly covering the exposed portion of the conductive pillar above the intermetal dielectric (IMD) material;
forming a conformal and uniform reference layer of a ferromagnetic material on the conformal seed layer;
forming a conformal and uniform dielectric tunnel barrier layer on the conformal and uniform reference layer; and
forming a conformal and uniform free layer of a ferromagnetic material on the conformal and uniform dielectric tunnel barrier layer.

17. A method of fabricating a magnetic tunnel junction (MTJ) device, the method comprising:
providing a bottom electrode buried in an intermetal dielectric (IMD) material, the bottom electrode extending in a lateral direction;
forming an outer conductive electrode on the IMD material;
forming a via through the outer conductive electrode and stopping on the IMD material; and forming a magnetic tunnel junction (MTJ) stack on a cylindrical sidewall of the via such that the MTJ stack surrounds a cavity having a bottom surface comprising an exposed IMD material, the MTJ stack comprising a free layer, a dielectric tunnel barrier and a reference layer;

removing the exposed IMD material from the bottom surface to expose the bottom electrode; and forming an inner conductive electrode comprising a pillar contacting the bottom electrode by filling the cavity with a conductive material.

18. The method of claim 17, wherein forming the MTJ stack comprises:

forming a first cavity comprising the free layer comprising a ferromagnetic material formed on the cylindrical sidewall of the via;

forming a second cavity comprising the dielectric tunnel barrier formed on a cylindrical sidewall of the first cavity; and forming the cavity comprising the reference layer formed on a cylindrical sidewall of the second cavity.

19. The method of claim 18, wherein forming the free layer, reference layer and the dielectric tunnel barrier includes depositing by atomic layer deposition (ALD).

20. The method of claim 19, wherein forming the free layer comprises depositing a conformal and uniform free layer on the cylindrical sidewall and a bottom surface of the via and thereafter removing the conformal and uniform free layer from a bottom portion of the via while leaving the conformal and uniform free layer on the cylindrical sidewall of the via.

21. The method of claim 19, wherein forming the dielectric tunnel barrier comprises depositing a conformal and uniform dielectric tunnel barrier on the cylindrical sidewall and a bottom surface of first cavity and thereafter removing the conformal and uniform dielectric tunnel barrier from a bottom portion of the first cavity while leaving the conformal and uniform dielectric tunnel barrier on the cylindrical sidewall of the first cavity.

22. The method of claim 19, wherein forming the reference layer comprises depositing a conformal and uniform reference layer on the cylindrical sidewall and a bottom surface of second cavity and thereafter removing the conformal and uniform reference layer from a bottom portion of the second cavity while leaving the conformal and uniform reference layer on the cylindrical sidewall of the second cavity.

* * * * *

UNITED STATES PATENT AND TRADEMARK OFFICE
CERTIFICATE OF CORRECTION

PATENT NO. : 9,601,544 B2
APPLICATION NO. : 14/332018
DATED : March 21, 2017
INVENTOR(S) : Tai Min It is certified that error appears in the above-identified patent and that said Letters Patent is hereby corrected as shown below:

In the Specification

In Column 6 at Line 36, Change "Boltzman" to --Boltzmann--.

In Column 6 at Line 41 (approx.), Below "desired." insert --In some STT-MRAM designs, an MTJ is stacked parallel to the wafer plane with the cell having, for example, a circular disk shape, as illustrated by Figure 1A and Figure 1B. This configuration currently is often employed in the industry for STT-MRAM product development.--.

In Column 6 at Line 44, Change "and103b" to --and 103b--.

In Column 9 at Line 10, Change "aspect" to --aspect,--.

Signed and Sealed this
Third Day of October, 2017

Joseph Matal
*Performing the Functions and Duties of the
Under Secretary of Commerce for Intellectual Property and
Director of the United States Patent and Trademark Office*